United States Patent
Hanewald et al.

(10) Patent No.: US 7,799,691 B2
(45) Date of Patent: Sep. 21, 2010

(54) SYSTEM AND METHOD FOR ANISOTROPICALLY ETCHING A RECESS IN A SILICON SUBSTRATE

(75) Inventors: Thorsten Hanewald, Bad Dürkheim (DE); Andreas Hauser, Schrobenhausen (DE); Ingold Janssen, München (DE); Kai-Olaf Subke, Grafing (DE)

(73) Assignee: Infineon Technologies AG, Munich (DE)

( * ) Notice: Subject to any disclaimer, the term of this patent is extended or adjusted under 35 U.S.C. 154(b) by 126 days.

(21) Appl. No.: 11/328,688

(22) Filed: Jan. 10, 2006

(65) Prior Publication Data

US 2006/0175292 A1    Aug. 10, 2006

Related U.S. Application Data

(63) Continuation of application No. PCT/EP2004/051285, filed on Jun. 29, 2004.

(30) Foreign Application Priority Data

Jul. 11, 2003    (DE) .................................. 103 31 526

(51) Int. Cl.
*H01L 21/311*    (2006.01)
(52) U.S. Cl. .................. 438/700; 438/720; 438/734; 438/742; 216/67; 216/75
(58) Field of Classification Search .............. 438/700, 438/720, 734; 216/67, 75, 79; 257/412
See application file for complete search history.

(56) References Cited

U.S. PATENT DOCUMENTS

| | | | |
|---|---|---|---|
| 5,047,115 A | 9/1991 | Charlet et al. | |
| 5,614,445 A | 3/1997 | Hirabayashi | |
| 5,658,472 A | 8/1997 | Bartha et al. | |
| 5,935,874 A | 8/1999 | Kennard | |
| 6,380,095 B1 * | 4/2002 | Liu et al. | 438/719 |
| 6,440,870 B1 * | 8/2002 | Nallan et al. | 438/734 |
| 6,491,835 B1 * | 12/2002 | Kumar et al. | 216/51 |
| 2001/0001743 A1 * | 5/2001 | McReynolds | 438/710 |
| 2002/0003126 A1 * | 1/2002 | Kumar et al. | 216/67 |

(Continued)

FOREIGN PATENT DOCUMENTS

EP    1 329 948 A1    7/2003

(Continued)

OTHER PUBLICATIONS

S. Wolf, Silicon Processing for the VLSI Era, vol. 1, Lattice Press (1986), pp. 551-555.*

(Continued)

*Primary Examiner*—Duy-Vu N Deo
*Assistant Examiner*—Maki A Angadi
(74) *Attorney, Agent, or Firm*—Brinks Hofer Gilson & Lione

(57) ABSTRACT

A method and apparatus for anisotropically etching a recess in a silicon substrate is disclosed. Generally, a plasma is used for energetic excitation of a reactive etching gas, wherein the reactive etching gas is a constituent of a continuous gas flow. A recess is anisotropically etched in a silicon substrate using the reactive etching gas, during which time the recess id deepened by at least fifty micrometers without interrupting the gas flow of the reactive etching gas.

37 Claims, 3 Drawing Sheets

U.S. PATENT DOCUMENTS

| | | |
|---|---|---|
| 2002/0163051 A1 | 11/2002 | Gopal et al. |
| 2003/0022512 A1 | 1/2003 | Saito et al. |
| 2003/0077878 A1 | 4/2003 | Kumar et al. |
| 2003/0082847 A1 | 5/2003 | Turner et al. |

FOREIGN PATENT DOCUMENTS

| | | |
|---|---|---|
| JP | 2001-024058 | 1/2001 |
| WO | WO 00/63960 | 10/2000 |
| WO | WO 02/23609 A1 | 3/2002 |

OTHER PUBLICATIONS

English translation of Japanese Office Action for Japanese Patent Application No. 2006-519909 citing PCT Application No. 2002-542623 A, which corresponds to WO 00/06390, Mar. 31, 2009.

Office Action from European Patent Office for related application, mailed Jun. 18, 2009.

English translation of Office Action from European Patent Office for related application, mailed Jun. 18, 2009.

English translation of Japanese decision of refusal of Japanese patent application No. 2006-519909 entitled "Method for Anisotropically Etching a Recess in a Silicon Substrate and Use of a Plasma Etching System," mailed Oct. 27, 2009.

* cited by examiner

SYSTEM AND METHOD FOR ANISOTROPICALLY ETCHING A RECESS IN A SILICON SUBSTRATE

RELATED APPLICATIONS

The present patent document is a continuation of PCT Application Serial No. PCT/EP2004/051285, filed Jun. 29, 2004, which claims priority to German Patent Application Serial No. 103 31 526.8, filed Jul. 11, 2003, the entirety of which are both hereby incorporated by reference.

BACKGROUND

The present disclosure relates to a method in which a plasma is used for energetic excitation of a reactive etching gas. The etching gas serves for anisotropically etching a recess. The recess is for example a trench, in the case of which, at the opening edge, one lateral dimension is at least twice as large as a lateral dimension lying transversely at an angle of 90° with respect thereto, or a hole, in the case of which, at the opening edge, one lateral dimension is at most twice as large as a lateral dimension lying transversely at an angle of 90° with respect thereto. In the case of a hole, the two lateral dimensions are preferably equal in size. The opening is oval or rectangular in the case of a trench. The opening is oval, circular, rectangular or square in the case of a hole. Both holes and trenches are often referred to as trenches. The etching is more difficult in the case of holes than in the case of trenches since it is more difficult for the etching gases to reach the bottom of a hole in comparison with a trench having the same depth and the same width. Examples of recesses in micromechanics are furthermore recesses around beams, combs or tongues.

BRIEF SUMMARY

It is an object of the disclosure to specify a simple method for etching a recess having a depth of greater than 50 micrometers. Moreover, the intention is to specify a use of a plasma etching system.

The disclosure is based on the consideration that, inter alia, trenches or holes having a lateral dimension of less than 190 nm (nanometers) or even less than 90 nm are required in semiconductor technology. The depth of the trenches is less than 10 micrometers, typically 7 micrometers or 3 micrometers. These trenches serve for accommodating capacitors of memory cells that store charges in volatile fashion. Moreover, such trenches can be utilized e.g. for isolating transistors. The aspect ratio of depth to smallest lateral dimension at the opening edge is greater than 50:1, in particular greater than 70:1. By way of example, sulfur trifluoride $NF_3$ and $HBr_2$ is used for etching. One difficulty in the case of these trenches consists e.g. in creating an etching mask which is still present and maintains its mask function even after the silicon substrate has been etched by a number of micrometers. This means that the depth of the trenches cannot be increased arbitrarily.

Furthermore, the disclosure is based on the consideration that trenches having depths of hundreds of micrometers are etched in micromechanics. The aspect ratios are more moderate and are for example less than 20:1 or even less than 10:1. In this case, sulfur hexafluoride $SF_6$ and/or nitrogen trifluoride $NF_3$ are used as etching gases. In order to etch trenches having depths of more than 50 micrometers, cyclic methods are used in which a protective layer is repeatedly produced on the walls of the trenches in a deposition step after an etching step. The cyclic process implementation having e.g. hundreds of cycles requires expensive special systems, however, and leads to nonuniform trench walls, that is to say to so-called "scalloping".

It has been established, surprisingly, that a cyclic process implementation is not mandatory. Therefore, in the case of the method according to the disclosure, the reactive etching gas is a constituent of a continuous gas flow. At least one recess is deepened by at least fifty micrometers or by at least one hundred micrometers without interrupting the gas flow in the meantime. As a result, it is possible to use simple etching systems for etching deep trenches, e.g. etching systems such as are required for an etch of polycrystalline silicon. Moreover, there is no need for high pump powers and high-quality gas flow control units such as in the case of a method with cyclic gas flows that is performed at low pressures.

In one development, the reactive etching gas contains fluorine or fluorine compounds, preferably sulfur hexafluoride $SF_6$ and/or nitrogen trifluoride $NF_3$, in particular only one type of fluorine compounds. By using sulfur hexafluoride $SF_6$ in a high density plasma, it is possible to generate a sufficient number of fluorine radicals per etching area, with the result that etching rates of up to 6 micrometers per minute are achieved. The fluorine compounds mentioned are less hazardous than molecular fluorine. Fluorine or a fluorine compound is more reactive than other halogens or halogen compounds.

In a next development the reactive etching gas contains a fluorine-free additional gas, preferably an oxide forming agent, in particular molecular oxygen. The proportion contributed by the fluorine-free additional gas, in particular the proportion contributed by the oxygen gas flow, in the total active gas flow lies between 20% (percent) and 50% or between 30% and 40%, and is preferably 35%. This ensures that a sufficiently thick protective layer is formed at the trench edge. No protective layer can form at the bottom of the trench on account of the ions coming from the plasma. Moreover, the proportion contributed by the additional gas, in particular the oxygen, is crucial for the inclination of the sidewalls of the trench, as will be explained in more detail below. The undercut can also be controlled by way of the proportion contributed by the additional gas.

In another development, the etching gas contains only one noble gas, in particular helium or argon. As an alternative, the etching gas contains a plurality of noble gases, in particular helium and argon. The proportion contributed by the argon gas flow in the total inert gas flow lies between 25% and 65% or between 35% and 55%. The dilution of the active gas with an inert gas leads to an improved etching uniformity over a wafer having a diameter of greater than 150 mm (millimeters), greater than 200 mm or even greater than 300 mm. Moreover, the selectivity of the hard mask is increased. Furthermore, by virtue of the dilution with the noble gas, the overall process is stabilized with regard to unavoidable fluctuations of the gas flow.

In a next development, the proportion contributed by the gas flow comprising reactive etching gas in the total gas flow lies in the range of between 20% and 40% or in the range of between 25% and 35%, preferably between 28% and 32%. The etching rate and the undercut can be controlled by means of the proportion contributed by the reactive etching gas in the total gas flow.

In one development, the pressure during etching is greater than 0.05 mbar or greater than 0.1 mbar. The pressure during etching is preferably less than 0.5 mbar or less than 0.25 mbar. The etching rate, the inclination of the sidewalls of the trench and the undercut can be controlled by way of the pressure.

In one development, the plasma is generated with powers of between 300 watts and 1200 watts or between 500 watts and 1000 watts, in particular with 600 watts. Excessively high powers lead to an excessively great overheating. Excessively low powers lead to low etching rates. In one refinement, the frequency for generating the plasma is less than 100 MHz, e.g. in the case of an inductive coupling-in at 13.56 MHz. As an alternative, however, power is also coupled into the plasma with an electromagnetic radiation in the microwave range, that is to say with a frequency of greater than 1 gigahertz, in particular 2.45 GHz.

In a next development, a substrate bias voltage is generated with powers of greater than 50 watts or greater than 60 watts, preferably with powers of greater than 70 watts. The power for generating the substrate bias voltage is preferably less than 700 watts. Equivalently, the substrate bias voltage has a magnitude of more than 150 volts or more than 210 volts. The substrate bias voltage is preferably less than 600 volts. The substrate bias voltage, having a comparatively high magnitude, leads to an increased action of ions on the trench bottom and thus to rapid removal. The frequency for generating the substrate bias voltage is preferably less than 100 MHz.

The following optimized values hold true for a next development:

gas pressure 120 μbar, plasma power 600 watts, substrate bias voltage −220 volts, helium gas flow 126 sccm, oxygen gas flow 32 sccm, sulfur hexafluoride gas flow 59 sccm, argon gas flow 84 sccm, preferably no further gases being used. Deviations of these values by plus or minus five or ten percent also lie within the scope of the optimization.

In the case of the method according to the disclosure, in particular in the case of the optimized method, a temperature cycle is not required since the temperature remains unchanged, e.g. at 45° C. (degrees Celsius). A higher temperature leads to a rising etching rate. A lower temperature leads to greater sidewall protection. Apart from the standard waferless preconditioning and the self-cleaning methods, no additional conditioning is required. The etching of trenches with more than 50 micrometers can thus be introduced into standard semiconductor production.

In one development, the recess is a trench or a hole. The applicability of the method to the etching of deep holes is particularly surprising and was not foreseeable. Despite the narrow recess, it is possible to effect etching by more than 50 micrometers by means of a continuous method without the etching stopping, e.g. if etching gases do not reach the hole bottom. In one refinement, the aspect ratio between the smallest lateral dimension at the edge of the recess and the continuously etched depth of the cutout is greater than 8:1 or greater than 10:1.

In an alternative or additional refinement, the smallest lateral dimension at the edge of the cutout is less than twenty micrometers or less than ten micrometers.

In another refinement, the proportion made up by the opening of the cutout or the openings of the cutouts relative to the size of the original substrate surface into which the recess is introduced is less than 20% or less than 10% or less than 5%. The smaller the proportion, the greater the etching rates that can be achieved.

In one development, the angle of inclination of a wall of a recess that tapers with increasing distance from the substrate surface with respect to the substrate surface containing the edge of the cutout is greater than 91 degrees, greater than 92 degrees or greater than 93 degrees, the angle of inclination preferably being less than 110 degrees. The silicon substrate lies between the limbs of the angle. If an angle between the sidewall and the substrate surface is considered between whose limbs there is a substrate-free space, then the angles are less than 89°, less than 88° or less than 87°. A cutout tapering to a greater extent is easier to fill than a cutout having parallel sidewalls. Excessively great tapering limits the depth of the recess. The angle of inclination is preferably set by way of an oxygen proportion in the process gas.

In a next development, an etching mask is used for defining the position of the recess, in particular an etching mask made of silicon dioxide. The silicon dioxide was produced e.g. by means of a TEOS method (tetraethyl orthosilicate). Thermal silicon dioxide is also suitable as a material of the etching mask.

In a next development, no silicon-containing gas, in particular no gas with compounds containing silicon and fluorine, such as, e.g. $SiFi_4$, is introduced externally into a process or etching chamber utilized for etching. The method implementation is thereby simplified.

In a next development, the total gas flow lies between 200 sccm (standard cubic centimeters) and 500 sccm or between 250 sccm and 350 sccm, preferably between 295 sccm and 305 sccm. These gas flows were determined for an etching chamber volume as in a system of the type Lam TCP 9400 PTX, that is to say for a volume of approximately 30 liters. The average residence times of the species are important for the process. The average residence time results from the ratio of gas flow and gas pressure, so that a conversion to larger or smaller chamber volumes is possible using the above specifications.

In accordance with a further aspect of the disclosure, the object referring to the use is achieved by the use of a plasma etching system for the etching of at least one recess having a depth of greater than fifty micrometers or greater than one hundred micrometers with continuous gas flow, that is to say without interruption in the meantime, of gases which flow into an etching chamber of the plasma etching system.

In one development of the use, the plasma etching system does not contain a control unit for cyclic etching. The system is nevertheless used for etching trenches or holes deeper than 50 micrometers. In one refinement, the plasma etching system is additionally used for etching polycrystalline silicon layers, in particular during the processing of wafers containing a multiplicity of integrated circuits, e.g. MOS circuits (Metal Oxide Semiconductor), CMOS circuits (Complementary MOS), BiCMOS (Bipolar CMOS) or pure bipolar circuits. This means that an expensive special system is no longer required for the trench etching to depths of greater than 50 micrometers.

In one development, the composition of the gas flow remains the same during the etching of the recess. As an alternative or in addition, the magnitude of the gas flow also remains the same during the etching of the recess. A simple method implementation is thus possible. However, methods are also possible in which, despite a continuous gas flow, the gas flow quantity is altered during the etching, e.g. in order to influence the profile of the trench or in order to obtain more uniform conditions at the trench bottom throughout the etching.

BRIEF DESCRIPTION OF THE DRAWINGS

Exemplary embodiments of the disclosure are explained below with reference to the accompanying drawings, in which.

DETAILED DESCRIPTION OF THE DRAWINGS

Figure 1:
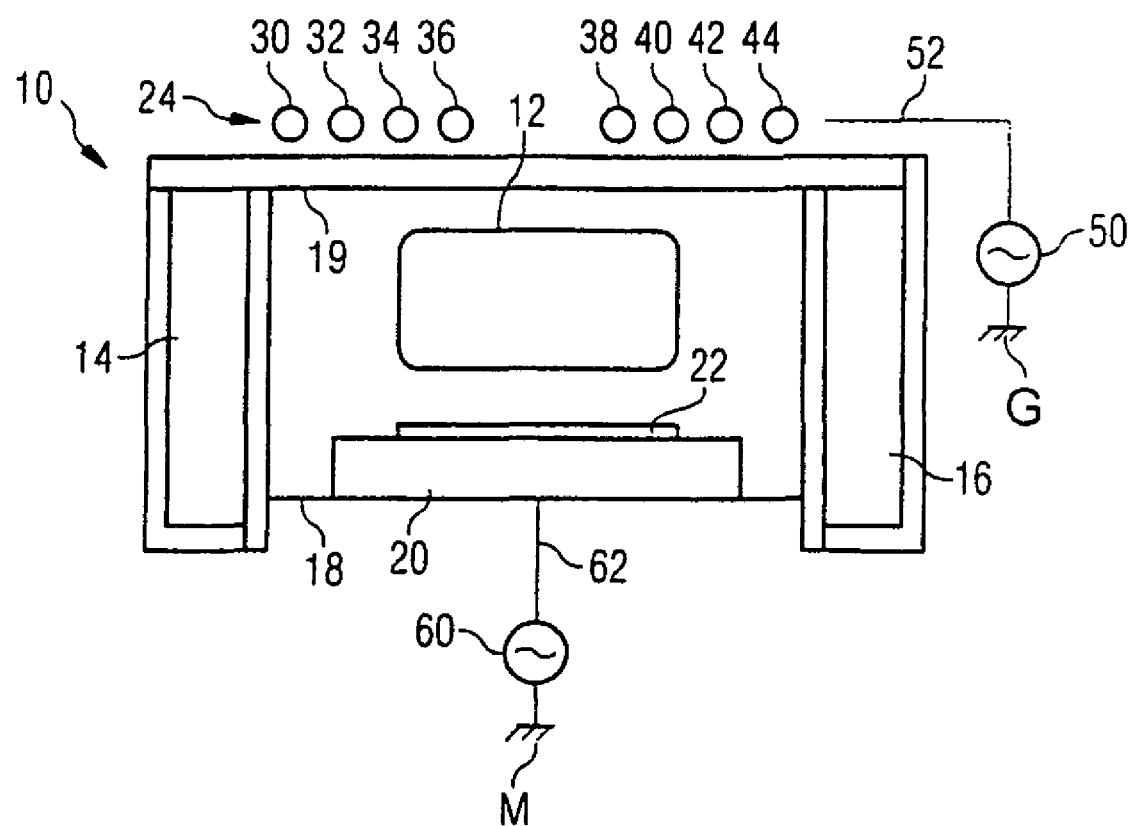
FIG. 1 shows the construction of a plasma etching system.

FIG. 1 shows a plasma etching system 10, e.g. a plasma etching system of the type Lam TCP 9400 PTX. An etching chamber with a plasma 12 is delimited by sidewalls, by a chamber bottom 18 and by a chamber cover 19. In the etching chamber, a substrate carrier 20 carrying a silicon wafer 22 is situated on the chamber bottom 18.

Moreover, the etching chamber contains one or more gas inlet openings (not illustrated) into which a gas mixture comprising argon, helium, sulfur hexafluoride $SF_6$ and oxygen flows. A portion of the admitted gas mixture and also reaction products flow out again through one or more gas outlet openings (not illustrated).

The plasma etching system additionally contains a coil 24 arranged above the etching chamber or in the upper region of the etching chamber and having turns 30 to 44. One connection of the coil is conductively connected to an AC voltage source 50 via a line 52. The other connection of the AC voltage source 50 is at a ground potential M. The frequency of the AC voltage source 50 is 13.56 MHz. The AC voltage source 50 consumes a power of 600 watts in order to generate the plasma 12.

Furthermore, the plasma etching system 10 contains an AC voltage source 60 operated at a frequency of 13.56 MHz. One connection of the AC voltage source 60 is connected to the electrically conductive substrate carrier 20 via an electrically conductive line 62. The other connection of the AC voltage source 60 is connected to the ground potential M. The AC voltage source 60 generates a substrate bias voltage of −220 volts with a power consumption of e.g. 70 watts.

The AC voltage sources 50 and 60 can be controlled independently of one another, so that the ion density and the ion energy can be regulated independently of one another. Furthermore, the relation of charged particles to uncharged particles can be predetermined.

Figure 2:
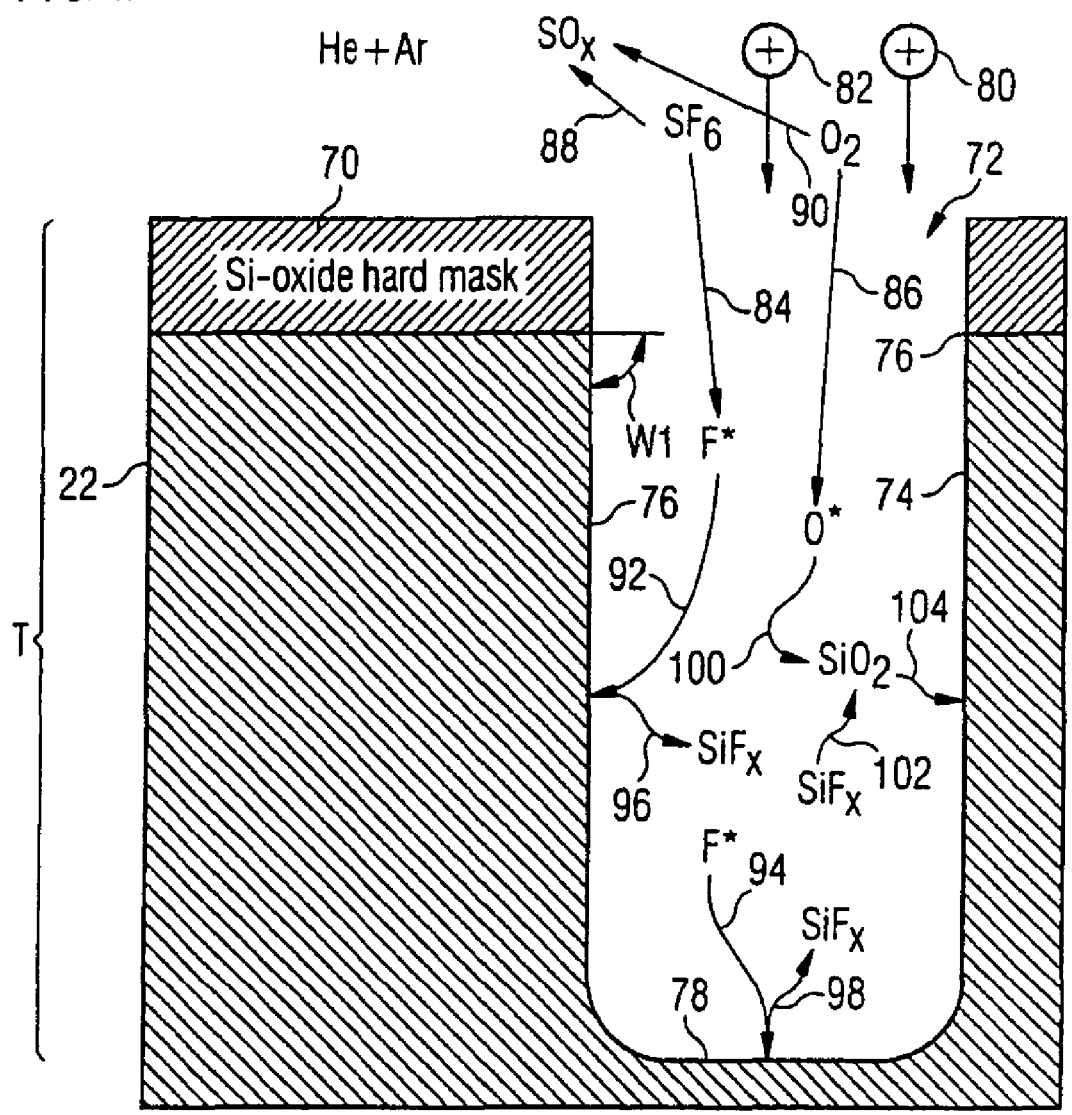
FIG. 2 shows a basic illustration of the operations during etching.

FIG. 2 shows a basic illustration of the operations during etching in the etching chamber of the plasma etching system 10. Prior to introduction into the etching chamber, a hard mask 70 made of silicon dioxide was produced on the silicon substrate 22 with the aid of a photolithographic process in order to predetermine the position of holes, in particular the position of a hole 72. By way of example for recesses having a depth of 100 micrometers or an etching time of 1000 seconds, the hard mask 70 has a thickness of 2.5 micrometers, an etching reserve of approximately 300 nanometers being included. The holes have round openings 74, peripheral sidewalls 76 and also rounded hole bottoms 78. The holes are etched simultaneously with identical depths. The hole 72 has a depth T of 75 micrometers in the exemplary embodiment.

Figure 3A:
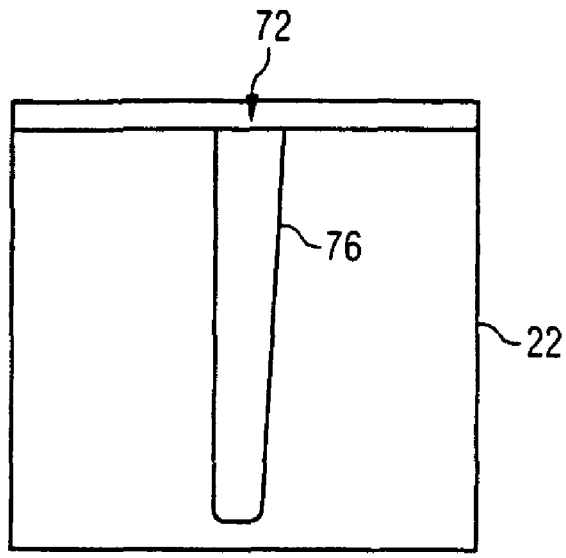
FIGS. 3A to 3C show cross sections through trenches with different sidewall inclinations on account of three different method implementations.

For etching the hole 72, which is also illustrated in FIG. 3A, the following constant parameters were complied with:
gas pressure 120 μbar,
plasma power 600 watts,
substrate bias voltage −220 volts,
helium gas flow 126 sccm,
oxygen gas flow 32 sccm,
sulfur hexafluoride gas flow 59 sccm, and
argon gas flow 84 sccm.
The following etching results were thus achieved:
hole depth T: 75 micrometers,
hole diameter at the opening 76: 10 micrometers,
opened area: 4% (3% to 5%),
angle W1 of inclination of the sidewall 76: 87°,
or angle W2 of inclination of the sidewall 76: 93°, and
etching rate: 6 micrometers/minute.

The following reactions or operations proceed, inter alia, in the etching chamber:

ions, in particular cations 80, 82, are accelerated from the plasma on account of the substrate bias voltage as far as the hole bottom 78, where they prevent the formation of a silicon dioxide film, under the action of the plasma 12, fluorine radicals F*, see arrow 84, and sulfur radicals form from the sulfur hexafluoride $SF_6$, under the action of the plasma 12, oxygen radicals O*, see arrow 86, form from the molecular oxygen, the sulfur radicals and a portion of the oxygen radicals O* react to form sulfur oxide compounds $SO_x$, e.g. to form sulfur monoxide SO or to form sulfur dioxide $SO_2$, see arrows 88 and 90, fluorine radicals F* react with the silicon of the silicon substrate 22 at locations of the sidewall 76 which have not yet been covered or have not yet been sufficiently covered with silicon dioxide, in particular in the vicinity of the trench bottom 78, see arrow 92, with the silicon at the trench bottom 78, see arrow 94. This gives rise to silicon-fluorine compounds $SiF_x$, e.g. silicon tetrafluoride $SiF_4$, see arrows 96 and 98, another portion of the oxygen radicals O* reacts with the silicon-fluorine compounds $SiF_x$ to form silicon dioxide $SiO_2$, which deposits on the sidewall 76, see arrows 100, 102 and 104. Other oxygen radicals O* also react directly with the silicon of the silicon substrate 22 to form silicon dioxide $SiO_2$.

A reproduction of an SEM image (Secondary Electron Microscopy) along a cross section through the hole 72 is illustrated in FIG. 3A.

Figure 3B:
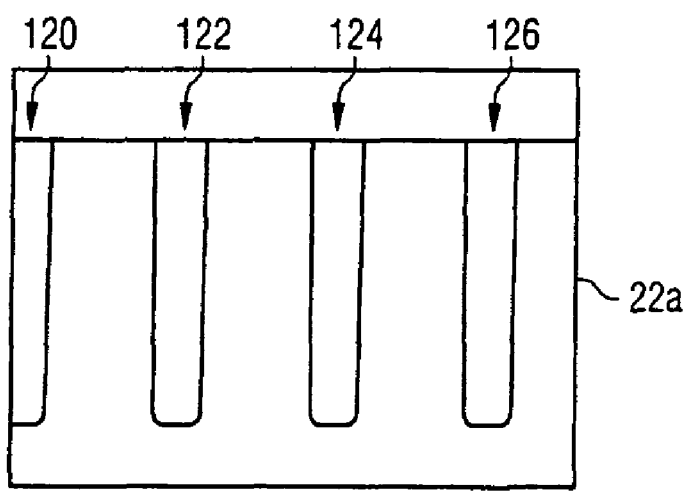

FIG. 3B shows a reproduction of an SEM image along a cross section through holes 120 to 126 that were etched using the following process parameters:
gas pressure 93 μbar,
plasma power 700 watts,
substrate bias voltage −200 volts,
helium gas flow 131 sccm,
oxygen gas flow 35 sccm,
sulfur hexafluoride gas flow 53 sccm, and
argon gas flow 131 sccm.
The following etching results were thus achieved:
hole depth T: 56 micrometers,
hole diameter at the opening: 10 micrometers,
opened area: 4% (3% to 5%),
angle W1 of inclination of the sidewall 76: 89°,
or angle W2 of inclination of the sidewall 76: 91°, and
etching rate: 4.5 micrometers/minute.

Figure 3C:
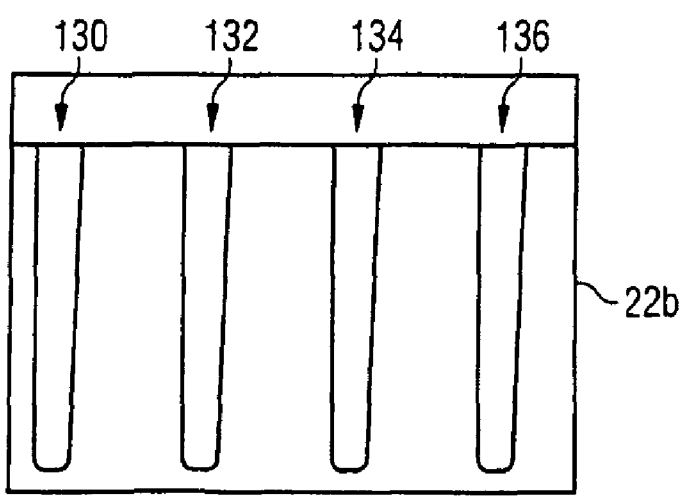

FIG. 3C shows a reproduction of an SEM image along a cross section through holes 130 to 136 that were etched using the following process parameters:
  gas pressure 120 μbar,
  plasma power 800 watts,
  substrate bias voltage −220 volts,
  helium gas flow 112 sccm,
  oxygen gas flow 50 sccm,
  sulfur hexafluoride gas flow 66 sccm, and
  argon gas flow 168 sccm.
The following etching results were thus achieved:
  hole depth T: 68 micrometers,
  hole diameter at the opening: 10 micrometers,
  opened area: 4% (3% to 5%),
  angle W1 of inclination of the sidewall 76: 88°,
  or angle W2 of inclination of the sidewall 76: 92°, and
  etching rate: 5 micrometers/minute.

The exemplary embodiments have been explained for a TCP process chamber (Transformer Coupled Plasma). Such chambers are also referred to inter alia as ICP (Inductive Coupled Plasma source), IPS (Inductive Coupled plasma Source) or as DPS chamber (Decoupled Plasma Source). The systems generate an HDP (High Density Plasma) with at least $10^{10}$ ions per cubic centimeter, preferably in the range of between $10^{11}$ ions/cm$^3$ and $10^{12}$ ions/cm$^3$.

It is therefore intended that the foregoing detailed description be regarded as illustrative rather than limiting, and that it be understood that it is the following claims, including all equivalents, that are intended to define the spirit and scope of this invention.

The invention claimed is:

1. A method comprising:
   using a plasma for energetic excitation of a reactive etching gas, wherein the reactive etching gas is a constituent of a continuous gas flow, and wherein the plasma is generated with a power between 300 watts and 1200 watts; and
   anisotropically etching a recess in a silicon substrate with the reactive etching gas, the step of anisotropically etching comprising:
   deepening the recess in the silicon substrate by at least seventy-five micrometers without interrupting the gas flow of the reactive etching gas, wherein a chemical mixture of the gas flow is substantially constant during the etching of the recess, wherein during the deepening of the recess, a protective layer of silicon dioxide that substantially prevents etching of sidewalls of the recess is produced on the sidewalls, and wherein during etching, the sidewalls remain substantially uniform,
   wherein a proportion of fluorine-free additional gas in the gas flow is between 30% and 40% by volume,
   wherein a silicon dioxide etching mask that is different from the protective layer of silicon dioxide produced on the sidewalls is utilized to define a position of the recess.

2. The method of claim 1, wherein the reactive etching gas comprises fluorine.

3. The method of claim 1, wherein the reactive etching gas comprises fluorine compounds.

4. The method of claim 1, wherein the reactive etching gas comprises sulfur hexafluoride $SF_6$.

5. The method of claim 1, wherein the reactive etching gas comprises nitrogen trifluoride $NF_3$.

6. The method of claim 1, wherein the reactive etching gas comprises a fluorine-free additional gas.

7. The method of claim 6, wherein the fluorine-free additional gas is an oxide forming agent.

8. The method of claim 7, wherein the oxide forming agent is molecular oxygen.

9. The method of claim 7, wherein the proportion of the fluorine-free additional gas flow in the reactive etching gas flow is between 20% and 50% by volume.

10. The method of claim 9, wherein the proportion of the fluorine-free additional gas flow in the reactive etching gas flow is 35% by volume.

11. The method of claim 1, wherein the reactive etching gas comprises one inert or noble gas.

12. The method of claim 11, wherein the inert or noble gas is helium.

13. The method of claim 11, wherein the inert or noble gas is argon.

14. The method of claim 1, wherein the reactive etching gas comprises a plurality of inert or noble gases.

15. The method of claim 14, wherein the plurality of inert or noble gases comprises at least one of helium or argon.

16. The method of claim 14, wherein the plurality of inert or noble gases comprises argon and the proportion of argon in the plurality of inert or noble gases is between 25% and 65% by volume.

17. The method of claim 1, wherein the proportion of reactive etching gas comprising the continuous gas flow is between 20% and 40% by volume.

18. The method of claim 1, wherein the proportion of reactive etching gas comprising the continuous gas flow is between 25% and 35% by volume.

19. The method of claim 1, wherein the proportion of reactive etching gas comprising the continuous gas flow is between 28% and 32% by volume.

20. The method of claim 1, wherein the pressure of the continuous gas flow during the deepening is greater than 0.05 mbar and less than 0.5 mbar.

21. The method of claim 1, wherein the plasma comprises a power between 300 watts and 1200 watts.

22. The method of claim 21, wherein the plasma comprises a power of 600 watts.

23. The method of claim 21, wherein a frequency for generating the plasma is less than 100 MHz.

24. The method of claim 1, further comprising:
   generating a substrate voltage with a power between 50 watts and 700 watts; and
   generating a substrate bias voltage with a power have a magnitude between 150 watts and 600 watts, wherein a frequency for generating the substrate bias voltage is less than 100 MHz.

25. The method of claim 1, wherein a ratio of a smallest lateral dimension at an edge of the recess and a continuously etched dept of the recess is greater than 8:1.

26. The method of claim 1, wherein a proportion of an opening of the recess relative to a size of the silicon substrate into which the recess is introduced is less than 20%.

27. The method of claim 1, wherein an angle of inclination of a wall of the recess is greater than 91 degrees.

28. The method of claim 27, wherein the angle of inclination of the wall of the recess is less than 110 degrees.

29. The method of claim 1, wherein the recess is anisotropically etched in the silicon substrate during processing of wafers comprising at least one of Metal Oxide Semiconductor circuits (MOS circuits), Complementary MOS circuits (CMOS circuits), Bipolar CMOS circuits (BiCMOS circuits), or pure bipolar circuits.

30. The method of claim 1, wherein the film corresponds to a silicon dioxide film.

31. A method comprising:
using a plasma for energetic excitation of a reactive etching gas, wherein the reactive etching gas is a constituent of a continuous gas flow, and wherein the plasma is generated with a power between 300 watts and 1200 watts; and
anisotropically etching a recess in a silicon substrate with the reactive etching gas, the step of anisotropically etching comprising: defining a position of the recess using an etching mask comprising silicon dioxide; and
deepening the recess in the silicon substrate by at least seventy-five micrometers without interrupting the gas flow of the reactive etching gas, wherein a chemical mixture of the gas flow is substantially constant during the etching of the recess, wherein during the deepening of the recess, a protective layer of silicon dioxide that substantially prevents etching of sidewalls of the recess is produced on the sidewalls, and wherein during etching, the sidewalls remain substantially uniform,
wherein a proportion of fluorine-free additional gas in the gas flow is between 30% and 40% by volume,
wherein a silicon dioxide etching mask that is different from the protective layer of silicon dioxide produced on the sidewalls is utilized to define a position of the recess.

32. The method of claim 31, where the composition of the gas flow does not change during the etching of the recess.

33. The method of claim 31, wherein the magnitude of the gas flow does not change during the etching of the recess.

34. A method comprising:
using a plasma for energetic excitation of a reactive etching gas, wherein the reactive etching gas is a constituent of a continuous gas flow, and wherein the plasma is generated with a power between 300 watts and 1200 watts; and
anisotropically etching a recess in a silicon substrate with the reactive etching gas, the step of anisotropically etching comprising:
deepening the recess in the silicon substrate by at least seventy-five micrometers without interrupting the gas flow of the reactive etching gas;
wherein:
the silicon substrate is biased with a substrate bias voltage of −220 volts plus or minus 10 percent of 220 volts;
a gas pressure of the continuous gas flow is 120 μbar plus or minus 10 percent of 120 μbar;
a power of the plasma is 600 watts plus or minus 10 percent of 600 watts;
during the deepening of the recess, a protective layer of silicon dioxide that substantially prevents etching of sidewalls of the recess is produced on the sidewalls;
during etching, the sidewalls remain substantially uniform; the continuous gas flow comprises:
a helium gas flow of 126 sccm plus or minus 10 percent of 126 sccm;
an oxygen gas flow of 32 sccm plus or minus 10 percent of 32 sccm;
a sulfur hexafluoride gas flow of 59 sccm plus or minus 10 percent of 59 sccm; and
an argon gas flow of 84 sccm plus or minus 10 percent of 84 sccm
a chemical mixture of the gas flow is substantially constant during the etching of the recess,
a proportion of fluorine-free additional gas in the gas flow is between 30% and 40% by volume, and
a silicon dioxide etching mask that is different from the protective layer of silicon dioxide produced on the sidewalls is utilized to define a position of the recess.

35. A method comprising:
using a plasma for energetic excitation of a reactive etching gas, wherein the reactive etching gas is a constituent of a continuous gas flow, and wherein the plasma is generated with a power between 300 watts and 1200 watts; and
anisotropically etching a recess in a silicon substrate with the reactive etching gas, the step of anisotropically etching comprising:
deepening the recess in the silicon substrate by at least seventy-five micrometers without interrupting the gas flow of the reactive etching gas;
wherein:
the silicon substrate is biased with a substrate bias voltage of −200 volts plus or minus 10 percent of 200 volts;
a gas pressure of the continuous gas flow is 93 μbar plus or minus 10 percent of 93 μbar;
a power of the plasma is 700 watts plus or minus 10 percent of 700 watts;
during the deepening of the recess, a film that substantially prevents etching of sidewalls of the recess is produced on the sidewalls;
during etching, the sidewalls remain substantially uniform; the continuous gas flow comprises:
a helium gas flow of 131 sccm plus or minus 10 percent of 131 sccm;
an oxygen gas flow of 35 sccm plus or minus 10 percent of 35 sccm;
a sulfur hexafluoride gas flow of 53 sccm plus or minus 10 percent of 53 sccm; and
an argon gas flow of 131 sccm plus or minus 10 percent 131 sccm,
a chemical mixture of the gas flow is substantially constant during the etching of the recess,
a proportion of fluorine-free additional gas in the gas flow is between 30% and 40% by volume, and
a silicon dioxide etching mask that is different from the protective layer of silicon dioxide produced on the sidewalls is utilized to define a position of the recess.

36. A method comprising:
using a plasma for energetic excitation of a reactive etching gas, wherein the reactive etching gas is a constituent of a continuous gas flow; and
anisotropically etching a recess in a silicon substrate with the reactive etching gas, the step of anisotropically etching comprising:
deepening the recess in the silicon substrate by at least seventy-five micrometers without interrupting the gas flow of the reactive etching gas;
wherein:
the silicon substrate is biased with a substrate bias voltage of −220 volts plus or minus 10 percent of 220 volts;
a gas pressure of the continuous gas flow is 120 μbar plus or minus 10 percent 120 μbar;
a power of the plasma is 800 watts plus or minus 10 percent of 800 watts;
during the deepening of the recess, a protective layer of silicon dioxide that substantially prevents etching of sidewalls of the recess is produced on the sidewalls;
during etching, the sidewalls remain substantially uniform;

the continuous gas flow comprises:
- a helium gas flow of 112 sccm plus or minus 10 percent of 112 sccm;
- an oxygen gas flow of 50 sccm plus or minus 10 percent of 50 sccm;
- a sulfur hexafluoride gas flow of 66 sccm plus or minus 10 percent of 66 sccm; and
- an argon gas flow of 168 sccm plus or minus 10 percent of 168 sccm, a chemical mixture of the gas flow is substantially constant during the etching of the recess;

a proportion of fluorine-free additional gas in the gas flow is between 30% and 40% by volume; and a silicon dioxide etching mask that is different from the protective layer of silicon dioxide produced on the sidewalls is utilized to define a position of the recess.

37. A method comprising:

using a plasma for energetic excitation of a reactive etching gas, wherein the reactive etching gas is a constituent of a continuous gas flow, and wherein the plasma is generated with a power between 300 watts and 1200 watts; and anisotropically etching a recess in a silicon substrate with the reactive etching gas, the step of anisotropically etching comprising:

deepening the recess in the silicon substrate by at least seventy-five micrometers without interrupting the gas flow of the reactive etching gas;

wherein the reactive etching gas comprises an inert gas and at least one of fluorine or a fluorine compound;

wherein between 30% and below 40%, by volume, of the reactive etching gas flow is oxygen;

wherein a chemical mixture of the gas flow is substantially constant during the etching of the recess wherein during the deepening of the recess, a protective layer of silicon dioxide that substantially prevents etching of sidewalls of the recess is produced on the sidewalls; and wherein during etching, the sidewalls remain substantially uniform, wherein a chemical mixture of the gas flow is substantially constant during the etching of the recess, wherein a proportion of fluorine-free additional gas in the gas flow is between 30% and 40% by volume, and wherein a silicon dioxide etching mask that is different from the protective layer of silicon dioxide produced on the sidewalls is utilized to define a position of the recess.

* * * * *